United States Patent
Tei et al.

(10) Patent No.: US 7,161,419 B2
(45) Date of Patent: Jan. 9, 2007

(54) SENSOR DEVICE AND A SIGNAL AMPLIFICATION DEVICE OF A SMALL DETECTION SIGNAL PROVIDED BY THE SENSOR

(75) Inventors: Koryo Tei, Tokyo (JP); Hiroyuki Kawanishi, Tokyo (JP); Kazuya Yano, Tokyo (JP)

(73) Assignee: Seiko NPC Corporation, Tokyo (JP)

( * ) Notice: Subject to any disclaimer, the term of this patent is extended or adjusted under 35 U.S.C. 154(b) by 0 days.

(21) Appl. No.: 10/963,918

(22) Filed: Oct. 12, 2004

(65) Prior Publication Data
US 2005/0116769 A1   Jun. 2, 2005

(30) Foreign Application Priority Data
Nov. 12, 2003   (JP)   ............................. 2003-383070
Nov. 12, 2003   (JP)   ............................. 2003-383107

(51) Int. Cl.
*H03F 1/02* (2006.01)
(52) U.S. Cl. .............................. 330/9; 330/302; 330/75
(58) Field of Classification Search .................... 330/9, 330/302, 75
See application file for complete search history.

(56) References Cited

U.S. PATENT DOCUMENTS 4,733,171 A * 3/1988 Milkovic .................... 324/142
4,906,996 A * 3/1990 George ........................ 341/118
5,319,370 A * 6/1994 Signore et al. ............. 341/120
5,811,808 A * 9/1998 Cannata et al. ............. 250/332
6,459,078 B1* 10/2002 Fowler ................... 250/214 A

FOREIGN PATENT DOCUMENTS

| JP | 6-045875 | 2/1994 |
| JP | 6-054118 | 2/1994 |
| JP | 9-218090 | 8/1997 |

* cited by examiner

*Primary Examiner*—Patricia Nguyen
(74) *Attorney, Agent, or Firm*—Jordan and Hamburg LLP

(57) ABSTRACT

An amplification device for a small detection signal has an amplification factor that is variable and also high accuracy offset cancellation. A first switching element selectively connects a normal phase input terminal of an operational amplifier either to a reference potential or to an output terminal of a sensor. An inverse phase input terminal is connected to the reference potential. A capacitor is connected to an output terminal of the operational amplifier and to an output buffer, a second switching element is arranged to selectively connect the capacitor to the reference potential. Resistors are selectively short circuited by switching elements to vary the amplification factor of the operational amplifier.

23 Claims, 4 Drawing Sheets

SENSOR DEVICE AND A SIGNAL AMPLIFICATION DEVICE OF A SMALL DETECTION SIGNAL PROVIDED BY THE SENSOR

BACKGROUND OF THE INVENTION

1. Field of the Invention

The present invention relates to an amplification device of a small detection signal with a sensor element, which amplifies an output signal of the sensor element by a operational amplifier. More specifically, the present invention relates to an amplification device for a small detection signal of sensor elements, such as a plurality of thermopile type infrared sensor elements, outputting a small detection signal of DC and low frequency range, which requires a means to prevent noise in the low frequency range.

2. Related Background Art

The recent high integration and low power consumption CMOS technology contributes largely to the miniaturization and power consumption reduction of the sensor devices. However, in the amplifier configured with differential amplification circuit such as CMOS operational amplifier, the input offset voltage caused by the threshold voltage variation is amplified to create an output offset voltage at an output terminal. The output offset voltage (referred to as "offset voltage" hereafter) becomes large enough, for example when CMOS operational amplifier is used in the amplification circuit in the infrared sensor that outputs a small detection signal of DC and low frequency, to push the amplifier out of linear operational range and may even create clipping state. Also especially when the small detection signal of DC and low frequency is input, the countermeasure against the noise in the low frequency range becomes a further problem in addition to the above offset voltage.

Up to now, the compensation method is known wherein a plurality of infrared sensor elements and the compensation elements having the same electrical characteristics but its signal value do not change even with infrared input are arranged contiguously. The offset value of the amplification circuit is obtained by operating a compensation element with a scanning means so that the output of sensor element is compensated, based upon the above obtained offset value as disclosed in Japanese Unexamined Patent Application Publication No. I19-218090.

However, the above described compensation method relates to offset voltage and the amplification factor of the amplification circuit is constant. Therefore, if the output of the sensor element is not uniform, there is an inconvenience that the output signal after amplification may be too small or too large. The object of the present invention is to avoid the above inconvenience and to provide an amplification device for the small detection signal of a multi-element sensor wherein an offset voltage of the multi-element sensor can be cancelled and an amplification factor of an operational amplification in the amplification circuit can be adjusted according to the output signal level of each sensor element.

The reference H06-45875 (Japanese Unexamined Patent Application Publication) discloses a switched capacitor amplifier circuit where a capacitor is formed between an inverting input terminal of an operational amplifier and reference voltage. For the cancellation actuation of an offset voltage, the capacitor becomes the load of the operational amplifier only at the time of cancellation actuation of the offset voltage. However, in the amplifier circuit disclosed by this reference, since variation in each capacitor resulting from the manufacturing process arises, it is difficult to fully cancel the voltage of offset. Furthermore, the noise in a low frequency cannot be reduced.

The reference H06-54118 (Japanese Unexamined Patent Application Publication) discloses a driving device of an image sensor having the following characteristic feature. FIG. 7 shows the driving device of the image sensor shown in the reference. A signal line L(1) receives an information signal detected by the photo detector of image sensors, and positive phase input terminal of an operational amplifier 21 is connected to this signal line. An output terminal of the operational amplifier 21 is connected to a positive input terminal of an operational amplifier 22 through an analog switch 24 and a capacitor 25. An analog switch 26 and a capacitor 27 are connected in juxtaposition between the positive input terminal (point A) and a ground potential. An output terminal of an operational amplifier 22 is connected to a positive input terminal of an operational amplifier 23 through an analog switch 28 and a capacitor 29. An analog switch 30 and a capacitor 31 are connected in juxtaposition between this positive input terminal (point B) and the ground potential. A switch 4 (1) is connected between the positive input terminal of the operational amplifier 21 and the ground potential. An analog switch 5 (1) is connected between the output terminal of the operational amplifier 23, and an output line OUTL. The operation of this circuit is explained as follows. At the time t1, capacitors 25 and 29 will be charged by setting analog switches 24, 26, 28 and 30 to ON. The electrical potential difference VC25 between terminals of capacitor 25 serves as VC25=20 (Vin+Vos1). The electrical potential difference VC29 between terminals of capacitor 29 serves as VC29=20 Vos2. (in this equality, Vin is input voltage, Vos1 and Vos2 are the input offset voltage of the operational amplifier 21 and 22, respectively). Next, at the time t2, the potential accumulated in signal-line L (1) will be discharged by setting analog switches 24, 26, 28 and 30 to OFF and the switch 4 (1) to ON. Then, at the time t3, by setting analog switches 24 and 28 to ON, electrical potential VA of point A will serves as VA=(20 Vos1−Vc25)/2+Vos2−−Vin+Vos3, and electrical potential VB of point B will serves as VB=(20(−10 Vin+Vos2)−Vc29)/2+Vos3=−100 Vin+Vos3. (in this equality, Vos3 is input offset voltage of the operational amplifier 23). Thereby, the input offset voltage Vos1 and Vos2 of operational amplifiers 21 and 22, respectively, are canceled, and then the whole circuit gain can be made into 100 times.

Concerning to the circuit disclosed in this reference, the positive terminals of the operational amplifiers 22 and 23 will be in a floating state from time t2 to time t3. Therefore, the electric charge charged by the capacitor 25 and 29 must continue being held during the period (time t2 to t3). The capacitors 27 and 29 formed for holding of the electric charge, and capacity with the big capacitor 25, 27, 29 and 31 is needed. Moreover, since it is dependent on the accuracy of capacitors 27 and 31, the accuracy of offset voltage is difficult to control with high precision. Furthermore, since the analog switches 24 and 28 are formed on the signal line of the operational amplifier, the noises by switching operation and the transmission delay by parasitism capacity arise.

SUMMARY OF THE INVENTION

In order to achieve the above object, an amplification device for a small detection signal of the present invention comprises; a first operational amplifier which amplifies said detection signal inputted from a positive input terminal; a first switching element which changes alternatively the signal inputted into the positive input terminal to either the detection signal or a reference potential; a capacitor which the potential of one terminal is determined in conjunction with an output of the first operational amplifier, and obtains an output of said amplification device from the other terminal of the capacitor; and a second switching element which is connected between the reference potential and the other terminal of the capacitor; thus cancels the offset voltage and reduces the noise in low frequency range.

According to the above amplification device of a small detection signal of the invention, the capacitor is arranged at the output of the operational amplifier and the second switching element at the output side is turned off earlier than the first switching element at the input side thus maintaining offset voltage without being affected by input of operational amplifier. Therefore, the offset voltage is cancelled after the output signal is amplified. This allows canceling the offset voltage as well as reducing the noise at low frequency range with two switching elements and one capacitor of small capacitance.

DESCRIPTION OF THE PREFERRED EMBODIMENTS

Figure 1:
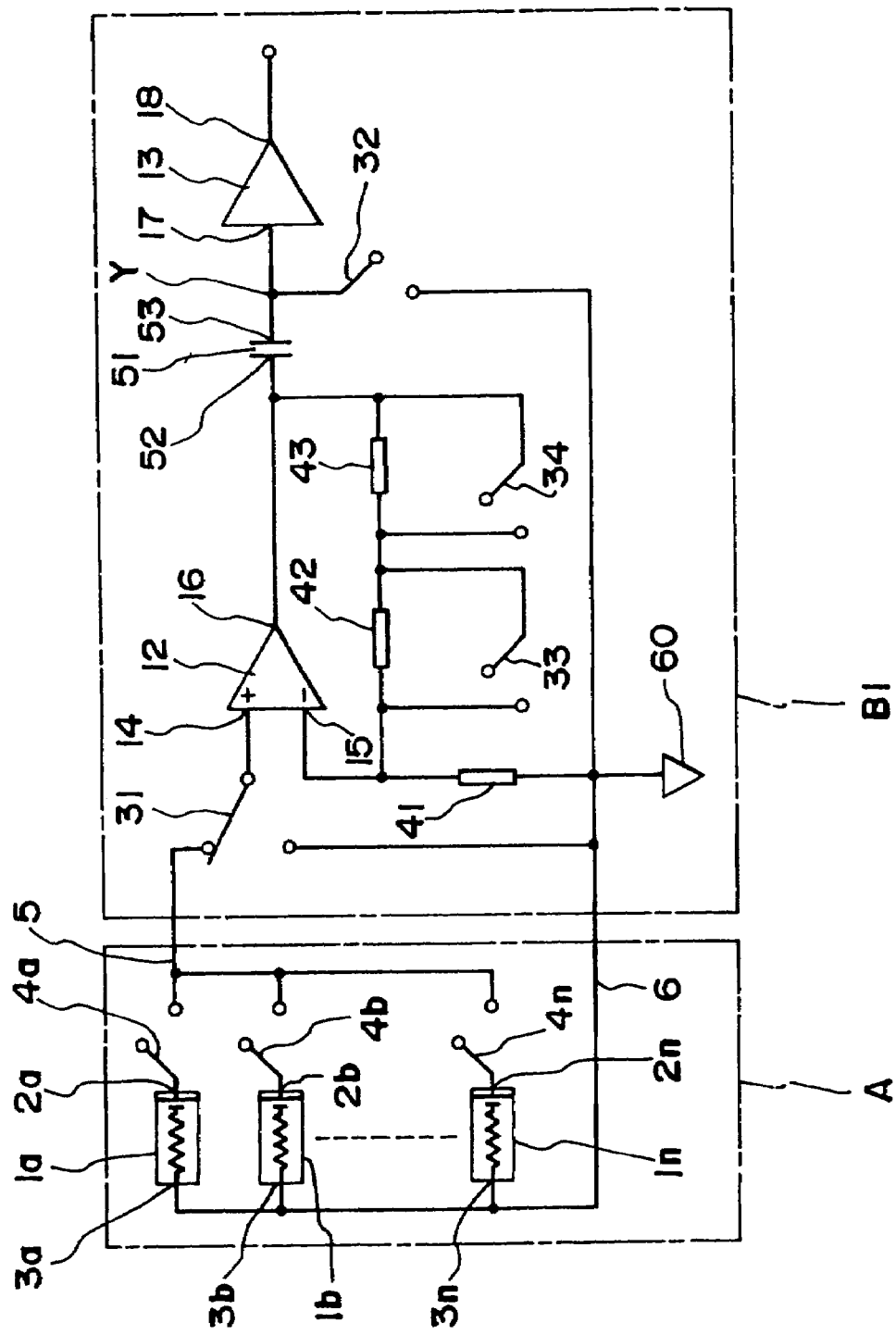
FIG. 1 is a block diagram of a first embodiment showing the configuration of an amplification device for a small detection signal of a multi-element sensor.

Hereinafter, the preferred embodiment will be explained based upon the attached drawings. At first, a first embodiment will be explained based upon the block diagram of FIG. 1. As is shown in FIG. 1, an amplification device for a small detection signal from a multi-element sensor comprises a sensor part A and an amplification part B1. The sensor part A comprises a multi-element sensor elements $1a–1n$ including n thermopile type infrared sensor elements (referred to "sensor element" hereafter). Output terminals of one side of $2a–2n$ of each sensor element $1a–1n$ are connected to an output terminal 5 of the multi-element sensor through each switching element $4a–4n$. The output terminal 5 is connected to a normal phase input 14 of an operational amplifier 12 through a first switching element 31 of the amplification part B1. And the output terminals $3a–3n$ of the other side of the above each sensor element $1a–1n$ are connected to a reference potential 60 through an output terminal 6 of the multi-element sensor.

Each switching element $4a–4n$ is, for example, a three terminal analog switch made of a MOS transistor. Each switching element $4a–4n$ is selected alternately to become on and the output terminal of sensor element $1a–1n$ corresponding to the on-state switching element $4a–4n$ is sent to the amplification part B1. The operation of the switching element $4a–4n$ is controlled by a clock signal from a control circuit that is not shown in the FIG. 1.

Next, the amplification part B1 will now be explained. An inverse phase input 15 of the operational amplification 12 is connected to the reference potential 60 through a resistor 41, and it is connected to an output terminal 16 of the above operational amplifier 12 through serially connected resistors 42 and 43. A third and a fourth switching element 33 and 34 are provided that short circuit the resistors 42 and 43. Above operational amplifier 12 is the normal phase operational amplifier configured with MOS transistors and the amplification circuit of the embodiment of the present invention functions as the normal phase operational amplifier. In the present specification, the amplification circuit means the part that is configured with the component that exists in the amplification part except an output buffer that will be described later.

The output terminal 16 of the operational amplifier 12 is connected to an input terminal 17 of an output buffer 13 through a capacitor 51. The output buffer 13 is also configured with MOS transistors and it provides the high impedance input terminal 17. With a second switching element 32 open, a terminal 53 of the capacitor 51 that is connected to the input terminal 17 is able to keep the charge immediately before as long as the input of the operational amplifier 12 does not change. The above output buffer 13 can be of any type as long as it provides the high input impedance 17 and the other configuration can be selected appropriately. Also an output terminal 18 of the above output buffer 13 is the output terminal to the following stage that is not shown in FIG. 1 and the connection point Y of the input terminal 17 of the above output buffer 13 and the other terminal 53 of the above capacitor 51 is connected to the reference potential 60 through the above second switching element 32.

A switching element 31 connects the normal input terminal 14 of operational amplifier selectively either to one of the output terminals $2a–2n$ of the sensor elements $1a–1n$ where the switching element $4a–4n$ is on or to the reference potential 60 and for example, it is a three terminal analog switch configured with MOS transistor. The second switching element 32 is also a three terminal analog switch configured with MOS transistor and the operation of the above switching element 31,32 are controlled by the clock signal from the control circuit that is not shown in FIG. 1.

The operation of the above configured embodiment of the present invention will be now explained. Supposing that the switching element $4a$ is selected to be on by the control circuit that is not shown, the purpose is to modify the amplification factor of the operational amplifier 12 according to the output level of the sensor element $1a$ corresponding to switching element $4a$. Supposing here the resistance values of the resistors 41,42,43 are respectively R1, R2, R3, then the resistance value affecting the amplification factor of operational amplifier 12 is 1+(R2+R3)/R1 when the switching elements 33 and 34 are off as shown in FIG. 1, 1+R2/R1 when only the fourth switching element 34 is on to short circuit the resistor 43, and 1+R3/R1 when only the third switching element 33 is on to short circuit both terminals of the resistor 42.

Hereafter, the situation will be explained where the resistance value 1+R2/R1 is selected to be optimum to adjust the amplification factor of operational amplifier 12 according to the output signal level of the above switching element $4a$ so that the third switching element 33 turns off and the fourth switching element 34 turns on. In this situation, at first, the first and the second switching elements 31 and 32 are connected to the reference potential 60 and the normal input terminal 14 of operational amplifier 12 and the connection point Y of each terminal 53,17 are also connected to the reference potential 60 (the first state).

Supposing that the reference potential 60 is 0V, the potential of output terminal 16 of the above operational amplifier 12 in the first state is Vx1, the potential of the connection point Y is Vy1, the input offset voltage of operational amplifier 12 is Vos, the resistance values of resistors 41 and 42 are respectively R1,R2, the capacitance of capacitor 51 is C and the electric charge in capacitor 51 charged in the first state is ΔQ, the following equation (1) is obtained.

$$Vy1 - Vx1 = -Vos \times (1 + R2/R1) = \Delta Q/C \quad (1)$$

That is, the charge that corresponds to the output voltage error created by input offset voltage Vos of the operational amplifier 12 is charged in capacitor 51.

Then, the second switching element 32 turns off to disconnect the connection point Y from the reference potential 60 (second state). In this second state, the input terminal 17 of the output buffer 13 is in a high impedance state and the terminal 53 of the capacitor 51 floats because the second switching element 32 is off. At the same time the normal input terminal 14 of the operational amplifier 12 is kept connected to the reference potential 60 and the potential of the output terminal 16 does not change so that the charge in capacitor 51 that is charged in the first state is held. Because the voltage held between a terminal 52 and 53 of the capacitor 51 is only the error voltage caused by the input offset voltage Vos, the capacitance of the capacitor 51 can be relatively small.

Then the first switching element 31 is disconnected from the reference potential 60 and is connected to the output terminal 5 (third state). The normal input terminal 14 of the operational amplifier 12 is connected, instead of to the reference potential 60, to the output terminal 2a of the sensor element 1a corresponding to the switching element 4a selected which is in the on state, and the output signal of the above sensor element 1a is input to the operational amplifier 12. Here the charge of capacitor 51 in first and second states is conserved. Supposing the potential of the output 16 in the third state is Vx3, the potential of the connection point Y is Vy3 and the potential of output signal of the above sensor element 1a is Vo3, we obtain the following equation (2):

$$Vy3 - Vx3 = Vy3 - (Vo3 + Vos) \times (1 + R2/R1) = \Delta Q/C \quad (2)$$

Inserting the equation (1) into the equation (2) we obtain the following equation (3):

$$Vy3 = Vo3 \times (1 + R2/R1) \quad (3)$$

With this equation (3) it is shown that in the third state, the output voltage Vy3 appears at the connection point Y, and that the error voltage Vos×(1+R2/R1) of the output voltage created by the input offset voltage Vos of the operational amplifier 12 is cancelled, that is, the offset voltage. The output voltage Vy3 is output through the output buffer 13 from the output terminal 18 to the next stage that is not shown.

The amplification circuit of the present embodiment can amplify, with the repetition of the first state, second state and third state, the output signal from sensor elements 1a~1n that is selected by the on state of the switching element 4a~4n without being affected by the input offset voltage of the operational amplifier 12. The transition time between the first state and the second state may be decided according to the necessary charge up time for the capacitor 51 to the voltage corresponding to the error Vos×(1+R2/R1). The transition time between the second state and the third state may be decided by the time required to switch off the second switching element 32. The transition time between the third state and the first state may be decided by the time for the error voltage charged in the capacitor 51 to cancel the offset voltage and this is appropriately decided according to the next stage circuit, for example, the third state may be switched to the first state according to the sampling timing of the next stage circuit.

As is shown above, in the amplification circuit of the embodiment of the present invention, the offset voltage caused by the input offset voltage Vos is kept between the terminal 52 and 53 of the capacitor 51 and then the output signal of the sensor element 1a~1n is input to the operational amplifier 12, the above offset voltage kept in the capacitor 51 is deducted to perform the offset cancellation. Therefore in this embodiment, the offset cancellation is possible with a simple configuration with one capacitor 51 and two switching elements 31 and 32 that makes possible the miniaturization of the amplification circuit, the reduction of the consumption power and, at the same time, high precision offset cancellation and noise reduction at the low frequency range. Also turning on or off each third and fourth switching element 33 and 34 according to the output signal level from the sensor elements 1a–1n changes the resistance value, and thereby the amplification factor of the operational amplifier 12 can be varied.

Figure 2:
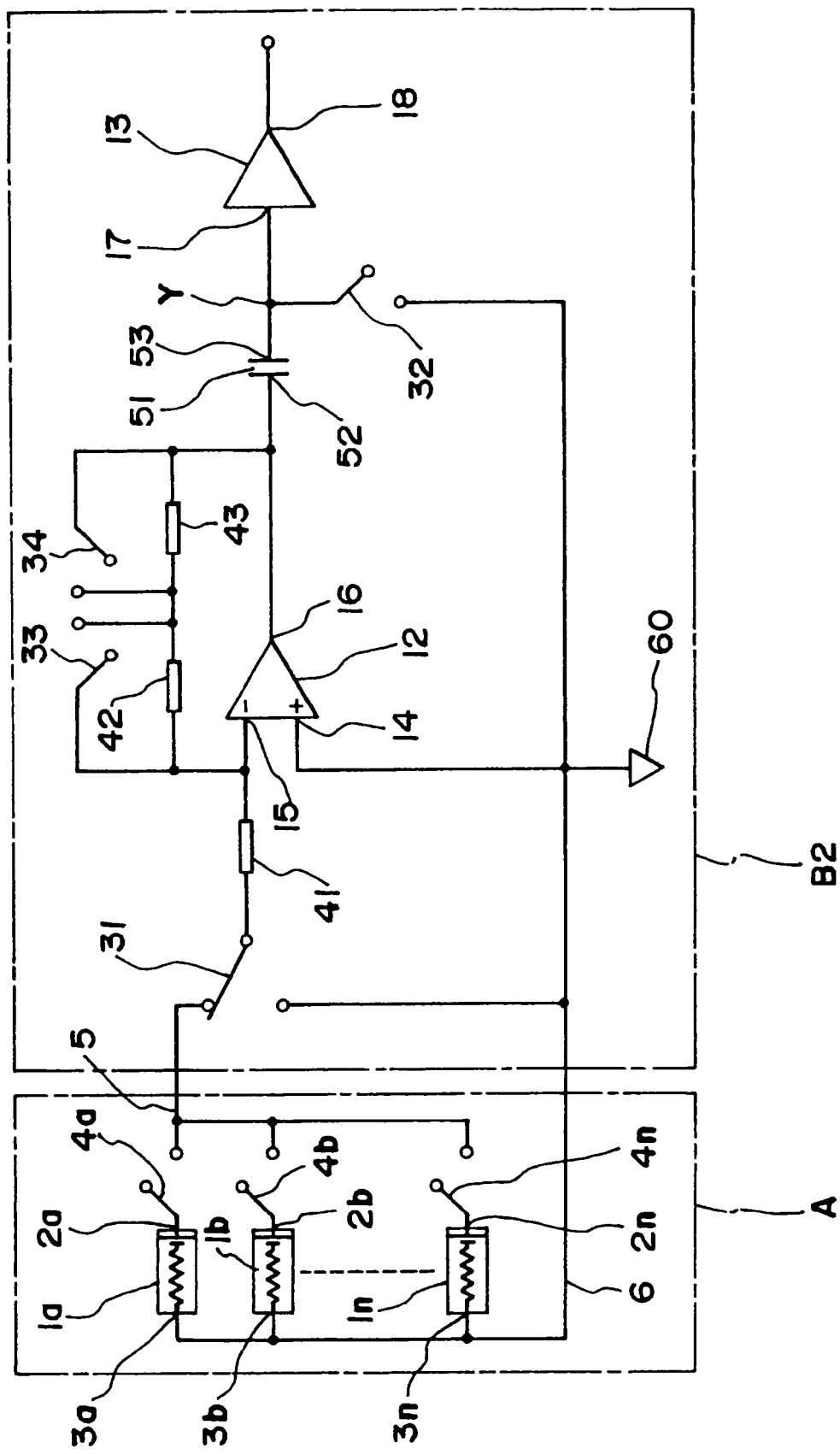
FIG. 2 is a block diagram of a second embodiment showing the configuration of an amplification device for a small detection signal of a multi-element sensor.

Subsequently, the second embodiment will be explained based upon the block diagram of FIG. 2. In the first embodiment, the operation of the amplification circuit is explained referring to a non-inverting operational amplification configuration but in this embodiment, an amplification circuit is an inverting operational amplification configuration and the same component elements are explained using the same symbol. As is shown in FIG. 2, the normal input terminal 14 of the operational amplifier 12 in the amplification part B2 is connected to the reference potential 60. The inverse input terminal 15 is connected to the first switching element 31 through the resistor 41 and also connected to the output terminal 16 through serially connected resistors 42 and 43. The above first switching element 31 connects, through the resistor 41, the inverse input terminal 15 selectively either to the reference potential 60 or the output terminal 5 of the sensor part A. The other configuration is the same as that of the first embodiment and description is omitted herein.

In this embodiment as in the first embodiment, each switching element 33,34 is turned on or off by the clock signal from the control circuit that is not shown, the resistors 42, 43 connected between the inverse input terminal 15 of the operational amplifier 12 and the output terminal 16 are selected to change the total resistance value so that the amplification factor of the operational amplification circuit of the operational amplifier 12 can be varied. Supposing here the resistance values of the resistor 41, 42, 43 are respectively R1, R2, R3, then the resistance value affecting the amplification factor of operational amplifier 12 is (R2+R3)/R1 when the switching elements 33 and 34 are off as shown in FIG. 2, R2/R1 when only the fourth switching element 34 is on to short circuit the resistor 43, and R3/R1 when only the third switching element 33 is on to short circuit the resistor 42.

Consequently, the operation of the amplification circuit of the above configured embodiment is explained and the switching element 4b is selectively switched on by the control circuit that is not shown. The amplification factor of the operational amplifier 12 adapting to the output level of the sensor element 1b corresponding to the switching element 4b is set by the resistance value (R2+R3)/R1 and each switching element 33 and 34 is in the off state (see FIG. 2). In this situation, at first, the first and the second switching element 31 and 32 are connected to the reference potential 60 and the inverse input terminal 15 of operational amplifier 12 and the connection point Y of each terminal 53,17 is also connected to the reference potential 60 (the first state).

Supposing that the reference potential 60 is 0V, the potential of output terminal 16 of the above operational amplifier 12 in the first state is Vx1, the potential of the connection point Y is Vy1, the input offset voltage of operational amplifier 12 is Vos, the resistance values of resistors 41, 42 and 43 are respectively R1, R2 and R3, the capacitance of capacitor 51 is C and the electric charge in capacitor 51 charged in state 1 is Q, we obtain the following equation (4).

$$Vy1-Vx1=Vos\times\{(R2+R3)/R1\}=\Delta Q/C \quad (4)$$

That means, as in the first embodiment, the charge corresponding to the output voltage error created by input offset voltage Vos of the operational amplifier 12 is charged in capacitor 51.

Then the second switching element 32 is switched off to disconnect the connection point Y from the reference potential 60 (second state, see FIG. 2). In this second state, the input terminal 17 of the output buffer 13 is in a high impedance state and the terminal 53 of the capacitor 51 floats since the second switching element 32 to be off. Also the inverse input terminal 15 of the operational amplifier 12 is kept connected to the reference potential 60 and the potential of the output terminal 16 does not change so that the charge in capacitor 51 that is charged in the first state is held. Here because the voltage between the terminal 52 and 53, that is kept by the capacitor 51, is only the error voltage by the input offset voltage, the capacitance of the capacitor 51 can be relatively small.

Then the first switching element 31 is disconnected from the reference potential 60 and is connected to the output terminal 5 of the element of the multi-element sensor (third state, see FIG. 2). With this state, the inverse phase input terminal 15 of the operational amplifier 12 is connected, instead of to the reference potential 60, to the output terminal 2b of the sensor element 1b which is in on the state according to the switching element 4b, and the output signal of the above sensor element 1b is input into the operational amplifier 12. Here the charge of capacitor 51 in the first and second state is conserved. Supposing the potential of the output 16 in the third state is Vx3, the potential of the connection point Y is Vy3 and the potential of output signal of the above sensor element 1b is Vo3, we obtain the following equation (5):

$$Vy3-Vx3=Vy3+(Vo3+Vos)\times\{(R2+R3)/R1\}=\Delta Q/C \quad (5)$$

Inserting the equation (4) into the equation (5) we obtain the following equation (6):

$$Vy3=-Vo3\times\{(R2+R3)/R1\} \quad (6)$$

With this equation (6) it is shown that in the third state, the output voltage Vy3 appears at the connection point Y, and that the error voltage Vos×{(R2+R3)/R1} of the output voltage created by the input offset voltage Vos of the operational amplifier 12 is cancelled. This output voltage Vy3 is output through the output buffer 13 from the output terminal 18 to the next stage circuit that is not shown. And in this embodiment, the input and the output of the operational amplifier 12 are inverted with the reference potential 60 as the center.

As is described the above, the operational effect of this embodiment that functions an inverting amplification circuit is the same as that of the first embodiment using the non-inverting amplification circuit. The cancellation of the offset voltage and the reduction of the noise in low frequency range are possible and also the amplification factor of the operational amplifier 12 can be varied according to the output signal level of the selected sensor element 1a–1n.

Figure 3:
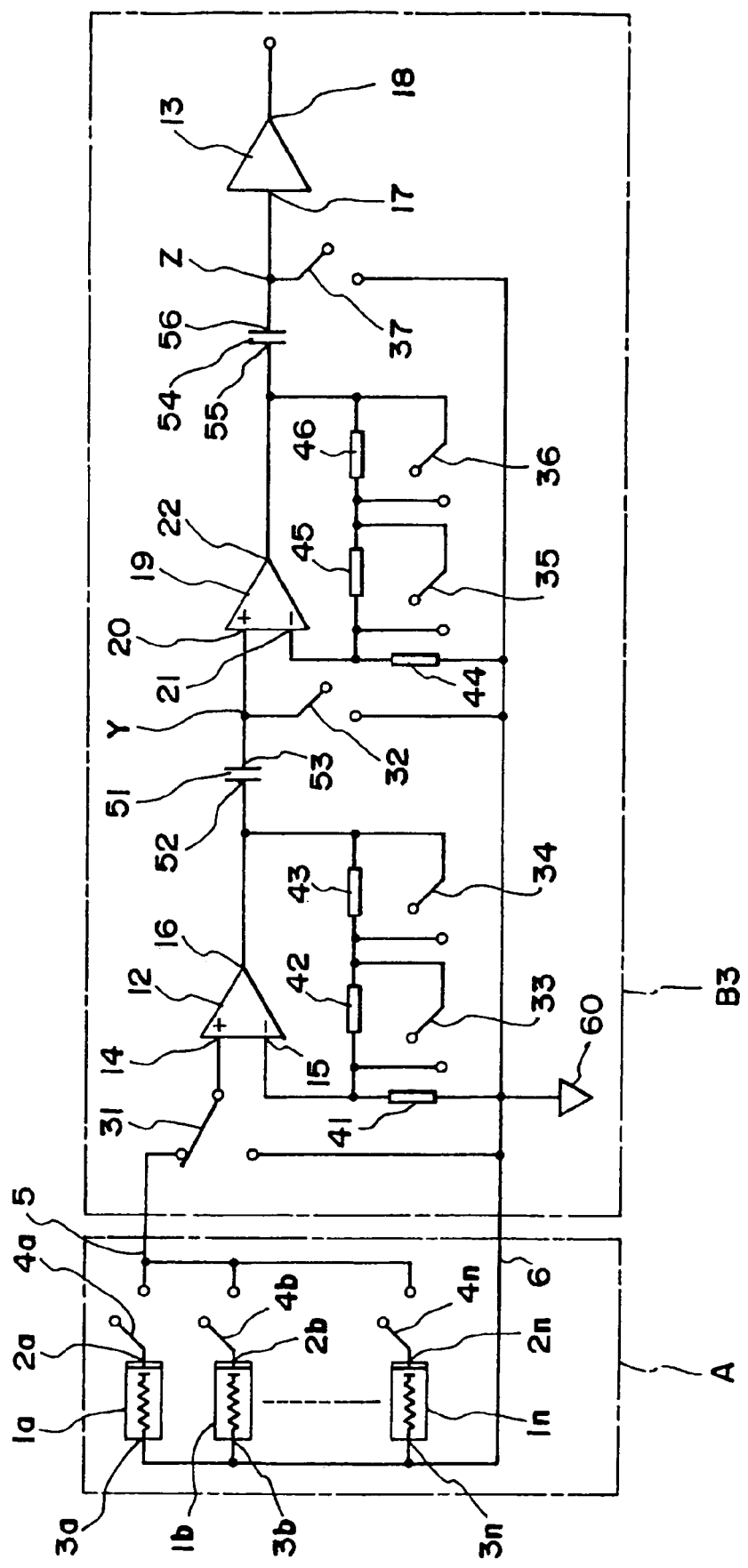
FIG. 3 is a block diagram of a third embodiment showing the configuration of an amplification device for a small detection signal with a multi-element sensor.

A third embodiment is explained based upon the block diagram of FIG. 3. In this embodiment, a plurality of operational amplifiers is connected in a cascade for the treatment of a smaller signal and to get a larger amplification factor. It functions as the non-inverting amplification circuit as is in the first embodiment. The same components having the same configurations as the first and the second embodiment will be explained with the same symbols as those of the first and the second embodiments. As is shown in FIG. 3, in the amplification part B3, the normal phase input terminal 14 of the operational amplifier 12 is connected to the output terminal 5 side of the multi-element in the sensor part A through the first switching element 31. The inverse phase input terminal 15 is connected to the reference potential 60 through the resistor 41 and, at the same time, is connected to the output terminal 16 through the serially connected resistors 42 and 43. To both terminals of the above resistors 42 and 43, the third and fourth switching elements 33 and 34 that short circuit the terminals are connected.

The output terminal 16 of the operational amplifier 12 is connected to a normal input terminal 20 of an output buffer 19 through the capacitor 51. This operational amplifier 19 is the same as the above operational amplifier 12 and its output terminal 22 is connected to the input terminal 17 of the output buffer 13 through a capacitor 54 that is same as the above capacitor 51. An additional second switching element 37, similar to the second switching element 32, is connected between the reference potential 60 and the point Z that connects the terminal 56 of the capacitor 54 and the input terminal 17 of the output buffer 13. The terminal 56 of the capacitor 54 is charged immediately before by switching off the second switching element 37 as long as the input of the operational amplifier 19 does not change. The output terminal 18 of the above output buffer 13 becomes the output terminal to a next circuit that is not shown in FIG. 3.

The normal phase input terminal 20 of the operational amplifier 19 is connected to the reference potential 60 through the second switching element 32. An inverse phase input terminal 21 is connected to the reference potential 60 through a resistor 44 and, at the same time, is connected to an output terminal 22 through the serially connected resistors 45,46 to configure the normal phase operational amplification device. In addition, to both terminals of the above each resistor 45 and 46, a fifth and a sixth switching element, 35 and 36, that short circuit the terminals, are connected. The operational amplifier 19 has high impedance input terminal 20 and when the second switching element 32 is off, it makes the terminal 53 of the capacitor 51 float, thus the charge in the capacitor 51 is kept constant as long as the input of the pre-stage of operational amplifier 12 does not change. The configurations of the resistors 45, 46 and each switching element 35, 36 are the same as those of the resistors 42, 43 and each switching element 33, 34.

As in the above embodiments, each switching element 33, 34 and 35 and 36 is on/off controlled by the clock signal from the control circuit that is not shown thus making the resistors 42, 43 and 45 and 46 to be selectable for connection between the inverse phase input terminal 15, 21 and the output terminal 16, 22 of the operational amplifier 12, 19. Accordingly the amplification factor of each normal phase amplification circuit including operational amplifiers 12 and 19 becomes variable by changing the resistance value. The variable resistance value for the operational amplifier 12 is the same as that described in the first embodiment.

As for the operational amplifier 19, supposing the resistance values of the resistors 44, 45, 46 is R4, R5, R5, then the resistance value related to the amplification factor of the operational amplifier 19 is 1+(R5+R6)/R4 in the state shown in FIG. 3. It is 1+R6/R4 when only the fifth switching element 35 is switched on to short circuit the resistor 45 and 1+R5/R4 when only the sixth switching element 36 is switched on to short circuit the resistor 46.

Hereafter the operation of the above configured embodiment of the present invention will be explained. Supposing that the switching element 4n is selected to be on and the amplification factors of the operational amplifier 12, 19 according to the output level of the sensor element 1n corresponding to the switching element 4n are obtained by the respective resistance values 1+(R2+R3)/R1 and 1+(R5+R6)/R4 with each switching element 33, 34, 35 and 36 in the off state (see FIG. 3). In this state, at first, the first switching element 31 and the second switching element 32, 37 are connected to the reference potential 60. Also the normal phase input terminal 14 of the operational amplifier 12, the normal input terminal 20 (the connection point Y) of the operational amplifier 19 and the connection point Z of each terminal 56 and 17 are connected to the reference potential 60 (first state).

With this configuration, by the same effect as described in the first embodiment, the error voltage corresponding to the input offset voltage of the operational amplifier 12 is created between terminals 52 and 53 of the capacitor 51. Also by the same effect, the error voltage corresponding to the input offset voltage of the operational amplifier 19 is created between the terminals 55 and 56 of the capacitor 54.

Then the second switching element 37 of the final stage (second stage in this embodiment) operational amplifier 19 is switched off (No.1 of the second state, see FIG. 3). With this configuration, the terminal 56 of the capacitor 54 floats, and as the normal phase input 20 of the operational amplifier 19 is connected to the reference potential 60, the error voltage corresponding to the input offset voltage of the operational amplifier 19 is kept in between the terminals 55 and 56 of the capacitor 54.

After that, the second switching element 32 of the first stage operational amplifier 12 is switched off (No.2 of the second state, see FIG. 3). With this configuration, the terminal 53 of the capacitor 51 floats, and as the normal phase input 14 of the operational amplifier 12 is connected to the reference potential 60, and the error voltage corresponding to the input offset voltage of the operational amplifier 12 is kept between the terminals 52 and 53 of the capacitor 51.

Then the first switching element 31 is disconnected from the reference potential 60 (see FIG. 3) and connected to the output terminal 2n of the sensor element 1n through the output terminal 5 and the switching element 4n being in the on state. With this configuration, the normal phase input terminal 14 of the operational amplifier 12 is connected to the above output terminal 2n instead of the reference potential 60 and the output signal of the above sensor 1n is input to the above operational amplifier 12. And as the result, by the same effect as described in the first embodiment, the output voltage of the operational amplifier 12 of which offset voltage is cancelled appears at the connection point Y. This output voltage is input to the operational amplifier 19 and by the same effect as described in the first embodiment, the output voltage of the operational amplifier 19, of which the output voltage is cancelled, appears at the connection point Z. Then this output voltage is output through the output buffer 13 from the output terminal 18 to the next stage that is not shown.

As described in this embodiment, even with the multistage operational amplifier based upon the amplification circuit of the first embodiment, the offset of each operational amplifier is cancelled and also the noise in low frequency range is reduced with the following steps: at first connecting the first switching element 31 and each second switching element 32,37 to the reference potential 60 to charge each stage capacitor 51,54 with the offset voltage of each stage amplifier 12, 19; switching off each second switching element 32,37 starting from the last second switching element 37 to keep the charge of each stage between the terminals 52,53 and 55,56 of capacitors 51,54; and finally switching the first switching element 31 to the output terminal 2a–2n of the sensor element 1a–1n.

Figure 4:
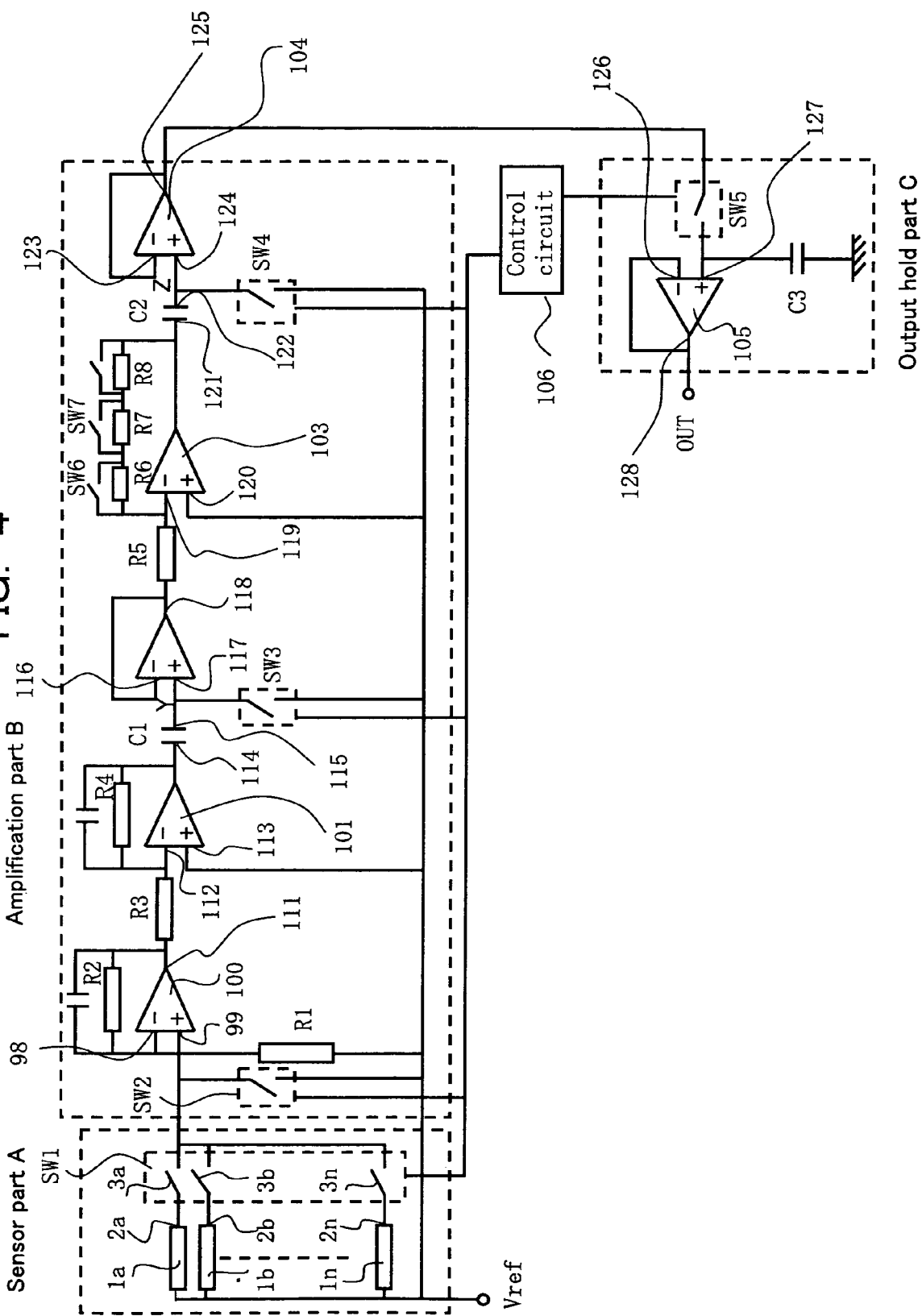
FIG. 4 is a block diagram of a fourth embodiment showing the configuration for an amplification device of a small detection signal.

The present invention is not limited to embodiments discussed above. For example, in the third embodiment, the stage is two but it can be three or more, as long as the operational amplifier 19 at the second stage or more has the high impedance input terminal 20, 21. And it is also possible to configure the multistage amplification circuit as inverting as described in the second embodiment. Further, the sensor elements 1a–1n are not limited to a thermopile infrared sensor but may be the source provided they output a small detection signal of DC and low frequency. The fourth embodiment of the invention will now be explained with reference to FIG. 4. An amplification device for a small detection signal of a multi-element sensor includes a sensor part A, an amplification part B and an output hold part C.

The sensor part A comprises a multi-element sensor having, for example, n thermal type infrared sensor elements (refer to "sensor element" hereafter) 1a–1n. One output terminal 2a–2n of each sensor element 1a–1n is connected to the normal phase input terminal 99 of the first operational amplifier 100 through switching circuit SW1 having switching elements 3a–3n. Non-inverting input terminal 99 is connected to the reference potential Vref through the switching element SW2. Each switching element 3a–3n is, for example, a 3 terminal switching element configured by a MOS transistor and only the selected switching element is turned on by the control circuit 106. Accordingly, the output signal of the sensor element 1a–1n corresponding to the switching element 3a–3n that becomes on is output to the amplification part B.

Next, the amplification part B will be explained. The inverse phase input terminal 98 of the first operational amplifier 100 is connected to the reference potential Vref through the resistor R1 and at the same time, is connected to the output terminal 111 of the first operational amplifier 100 through the resistor R2. The first operational amplifier 100 is the amplifier configured by MOS transistor of which an amplification factor is decided by the resistance values of the resistors R1 and R2 and the amplification factor is set to be double in this embodiment. The amplification factor of 2–4 times is suitable for the first operational amplifier 100 but 2 times is selected to minimize the noise effect from the amplifier located in latter stage. The first operational amplifier 100 is the normal phase input operational amplifier and the output 111 is connected to the inverse phase input terminal of the own operational amplifier 100 through the resistor R2. And the output terminal 111 is connected to the inverse phase terminal 112 of the second operational amplifier 101 through the resistor R3 and its normal input terminal 113 is connected to the reference potential Vref. The output terminal of the second operational amplifier 101 is connected to the inverse phase input terminal 112 through the resistor R4. The second operational amplifier 101 is the amplifier configured by MOS transistor, as same as the first operational amplifier 100, of which the amplification factor is decided by the resistance values of the resistors R3 and R4, and in this embodiment, the amplification factor is set to be 100 times. It is effective to make the second operational amplifier 101 an inverse phase input operational amplifier in order to avoid the wraparound input of the signal noise from other circuit. The output terminal of the second operational amplifier 101 is connected to the normal phase input terminal 117 of the first buffer 102 through the capacitor C1. And the normal phase input terminal 117 of the first buffer 102 is connected to the reference potential Vref through the switching element SW3. The first buffer 102 is also configured by a MOS transistor and its normal phase input terminal 117 is normally in a high impedance state. The terminal 115 of the capacitor C1 that is connected to the normal phase input terminal 117 is, with switching element SW3 off, able to hold the data immediately before, as long as the input from the second operational amplifier 101 does not change. Also as its input terminal is in a high impedance state, the first buffer 102 is effective to lower the impedance and to send data to the third operational amplifier 103 of the latter stage. The output terminal 118 of the first buffer 102 is connected to the inverse phase input terminal 116 of the buffer 102 and is connected at the same time to the inverse phase input terminal 119 of the third operational amplifier 103 through the resistor R5. Also the inverse phase input terminal 119 of the third operational amplifier 103 is connected to the output terminal of the third operational amplifier 103 through the serially connected resistors R6, R7, R8. Between the terminals of each of resistors R6, R7, R8, the switching elements SW6, SW7, SW8 short circuiting each of the terminals are provided. These switching elements SW6, SW7, SW8 are arranged to make the amplification factor of the third operational amplifier 103 variable and, with controlling the on-state of these switching elements, the feedback resistance value is set to be able to obtain a desired amplification factor. Also, the normal phase input terminal 120 is connected to the reference potential Vref. It is effective to arrange the third operational amplifier 103 in an inverting configuration in order to avoid the wraparound input of the signal noise from other circuits. The output terminal of the third operational amplifier 103 is connected to the normal phase input terminal 124 of the second buffer 104 through the capacitor C2. The normal phase input terminal 124 of the second buffer 104 is connected to the reference potential Vref through the switching element SW4. The second buffer 104 is also configured by a MOS transistor and its normal phase input terminal 124 is normally in a high impedance state. The terminal 122 of the capacitor C2 that is connected to the normal phase input terminal 124 is, with switching element SW4 off, able to hold the data immediately before, as long as the input from the third operational amplifier 103 does not change. Also as its input terminal is in a high impedance state, the second buffer 104 is effective to lower that impedance and to send data to the latter stage circuit.

The output terminal 125 of the second buffer 104 is connected to the inverse phase input terminal 123 of the second buffer 104 and at the same time is connected to the normal phase input 127 of the third buffer 105 of the output hold part C through the switching element SW5. Also between the normal input terminal 127 of the third buffer 105 and the reference potential Vref, a capacitor C3 is arranged and during the on-state of the switching element SW5 the capacitor C3 is charged according to the potential of the output terminal 125 of the third buffer 104. This charge is maintained during the off-state of the switching element SW5. When the switching element SW5 turns on at the next step, the potential corresponding to the next data appears at the output terminal 125 and the potential of the capacitor C3 is set again according to that output.

Subsequently, the operation of the amplifier of above configured embodiment of the present invention will be explained. Now, the operation will be explained with the condition where the switching element 4n is supposed to be on by the control circuit 106; the operational factor of the third operational amplifier 103, adapting to the output level of the sensor 1n corresponding to the switching element 4n, is obtained by the resistance value 1+(R6+R7+R8)/R5; and each switching element SW6, SW7, SW8 is in the off-state.

From this state, at first, turn on the first switching element SW2, the second switching element SW3 and the third switching element SW4 to connect the normal phase input terminal 99 of the first operational amplifier, the normal phase input terminal 117 (connection point Y) of the first buffer and the normal phase input terminal 124 (connection point Z) of the second buffer to the reference potential Vref (state 1). With this connection, the output voltage error caused by the input offset voltage Vos of the first operational amplifier 100 is amplified by the amplification factor of the second operational amplifier and charged into the capacitor C1. The charge that corresponds to the output voltage error created by input offset voltage Vos2 of the third operational amplifier 103 is charged in capacitor C2.

Then, switch off the switching element SW4 and cut off the connection between the connection point Z and the reference potential Vref (the second state). With this configuration, the terminal 122 of the capacitor C2 floats, and as the normal phase input 120 of the third operational amplifier 103 is connected to the reference potential Vref, the error voltage corresponding to the input offset voltage of the third operational amplifier 103 is held between the terminals 121 and 122 of the capacitor C2. Then switch off the switching element SW3 and cut off the connection between the connection point Y and the reference potential Vref (the third state). In this state, the terminal 115 of the capacitor C1 floats. With this condition, because the normal phase input terminal 99 of the first operational amplifier 100 is connected to the reference potential Vref, the error voltage corresponding to the input offset voltage appears at the output terminal 111 of the first operational amplifier 100. The error voltage amplified by the amplification factor of the second operational amplifier is held in the capacitor C1.

Subsequently, the switching element SW2 is turned off to cut off the connection between the normal phase input terminal 99 of the first operational amplifier 100 and the reference potential Vref and the switching element SW1 is turned on to connect the normal input terminal 99 to the output terminal 2n of the sensor element 1n (the fourth state). With this step, the output of the sensor element 1n is amplified by the first and second operational amplifiers 100,101 wherein the offset voltage of the first operational amplifier 100 is cancelled and the voltage appears at the connection point Y. The output voltage of the connection point Y is input to the first buffer 102 and the third amplifier 103 where the offset voltage is cancelled as well and the voltage appears at the connection point Z. In this embodiment too, the offset voltage of the first and the second operational amplifier can be cancelled and at the same time the noise at the low frequency range can be reduced.

What is claimed is:

1. An amplification device for a detection signal provided by a sensor element comprising:

a first operational amplifier having a first amplifier first input, a first amplifier second input, and a first amplifier output;

a first switching element connected to said first amplifier first input, an input path for said detection signal, and a reference potential, said first switching element being configured to alternately set said first amplifier first input to a potential of said detection signal and said reference potential;

a capacitor having a first capacitor terminal connected to said first amplifier output and a second capacitor terminal providing an output signal;

a second switching element connected between said reference potential and said second capacitor terminal; and a control circuit controlling said first switching element and said second switching element to sequence through a first, second and third switch configuration wherein:

said first switch configuration has said first switching element setting said first amplifier first input to said reference potential, and has said second switching element connecting said second capacitor terminal with said reference potential;

said second switch configuration has said first switching element setting said first amplifier first input to said reference potential, and has said second switching element in an open state disconnecting said second capacitor terminal from said reference potential;

said third switch configuration has said first switching element setting said first amplifier first input to said potential of said detection signal, and has said second switching element in said open state disconnecting said second capacitor terminal from said reference potential.

2. The amplification device according to claim 1, further comprising:

said first amplifier first input being a first amplifier positive input;

said first amplifier second input being a first amplifier negative input;

a first resistance connected between said reference potential and said first amplifier negative input; and a feedback resistance connected between said negative input terminal and said first amplifier output.

3. The amplification device according to claim 2, wherein said feedback resistance comprises:

a first feedback resistance and a second feedback resistance serially connected between said first amplifier negative input and said first amplifier output;

a third switching element connecting terminals of said first feedback resistance; and a fourth switching element connecting terminals of said second feedback resistance.

4. The amplification device according to claim 1, further comprising:

said first amplifier first input being a first amplifier positive input;

said first amplifier second input being a first amplifier negative input;

said first amplifier negative input, said first amplifier output and said reference potential being interconnected by a gain setting feedback circuit.

5. The amplification device according to claim 4, further comprising:

a second operational amplifier having a second amplifier positive input, a second amplifier negative input and a second amplifier output;

said second amplifier positive input connected to said second capacitor terminal;

said second amplifier negative input, said second amplifier output and said reference potential being interconnected by a gain setting feedback circuit.

6. The amplification device according to claim 5, further comprising a buffer amplifier having a buffer amplifier input connected to said second capacitor terminal.

7. The amplification device according to claim 1, further comprising a buffer amplifier having a buffer amplifier input connected to said second capacitor terminal.

8. The amplification device according to claim 1, further comprising an amplification circuit connecting said first capacitor terminal to said first amplifier output, said amplification circuit including:

a second operational amplifier having a second amplifier positive input, a second amplifier negative input and a second amplifier output;

said second amplifier negative input connected to said first amplifier output;

said second amplifier positive input connected to said reference potential;

said second amplifier negative input and said second amplifier output being interconnected by a gain setting feedback circuit; and said second amplifier output being connected to said first capacitor terminal.

9. The amplification device according to claim 1, wherein said first switching element comprises:

a first switch device interconnecting said first amplifier first input and said reference potential; and a second switch device interconnecting said first amplifier first input and said detection signal thereby forming a portion of said input path.

10. The amplification device according to claim 1, wherein said first switching element comprises:

a first switch device interconnecting said first amplifier first input and said reference potential; and a second switch device interconnecting said first amplifier first input and a plurality of input connections for receiving said detection signal from at least one of said plurality of input connection and thereby forming a portion of said input path.

11. The amplification device according to claim 1, further comprising:

said first amplifier first input being a first amplifier negative input;

said first amplifier second input being a first amplifier positive input;

said first amplifier negative input, said first amplifier output and said input path being interconnected by a gain setting feedback circuit.

12. The amplification device according to claim 11, further comprising a buffer amplifier having a buffer amplifier input connected to said second capacitor terminal.

13. A sensor device comprising:

a plurality of sensor elements each producing a small detection signal;

a first operational amplifier having a first amplifier first input, a first amplifier second input, and a first amplifier output;

a first switching element connected to said first amplifier first input, input paths receiving said detection signals of said plurality of sensors, and a reference potential, said first switching element being configured to alternately set said first amplifier first input to:
  a potential of a detected signal including at least one of said detection signals; and
  said reference potential;
a capacitor having a first capacitor terminal connected to said first amplifier output and a second capacitor terminal providing an output signal;
a second switching element connected between said reference potential and said second capacitor terminal; and
a control circuit controlling said first switching element and said second switching element to sequence through a first, second and third switch configuration wherein:
  said first switch configuration has said first switching element setting said first amplifier first input to said reference potential, and has said second switching element connecting said second capacitor terminal with said reference potential;
  said second switch configuration has said first switching element setting said first amplifier first input to said reference potential, and has said second switching element in an open state disconnecting said second capacitor terminal from said reference potential;
  said third switch configuration has said first switching element setting said first amplifier first input to said potential of said detected signal, and has said second switching element in said open state disconnecting said second capacitor terminal from said reference potential.

14. The sensor device according to claim 13, further comprising:
  said first amplifier first input being a first amplifier positive input;
  said first amplifier second input being a first amplifier negative input;
  a first resistance connected between said reference potential and said first amplifier negative input; and
  a feedback resistance connected between said negative input terminal and said first amplifier output.

15. The sensor device according to claim 14, wherein said feedback resistance comprises:
  a first feedback resistance and a second feedback resistance serially connected between said first amplifier negative input and said first amplifier output;
  a third switching element connecting terminals of said first feedback resistance; and
  a fourth switching element connecting terminals of said second feedback resistance.

16. The sensor device according to claim 13, further comprising:
  said first amplifier first input being a first amplifier positive input;
  said first amplifier second input being a first amplifier negative input;
  said first amplifier negative input, said first amplifier output and said reference potential being interconnected by a gain setting feedback circuit.

17. The sensor device according to claim 16, further comprising:
  a second operational amplifier having a second amplifier positive input, a second amplifier negative input and a second amplifier output;
  said second amplifier positive input connected to said second capacitor terminal;
  said second amplifier negative input, said second amplifier output and said reference potential being interconnected by a gain setting feedback circuit.

18. The sensor device according to claim 17, further comprising a buffer amplifier having a buffer amplifier input connected to said second capacitor terminal.

19. The sensor device according to claim 13, further comprising a buffer amplifier having a buffer amplifier input connected to said second capacitor terminal.

20. The sensor device according to claim 13, further comprising an amplification circuit connecting said first capacitor terminal to said first amplifier output, said amplification circuit including:
  a second operational amplifier having a second amplifier positive input, a second amplifier negative input and a second amplifier output;
  said second amplifier negative input connected to said first amplifier output;
  said second amplifier positive input connected to said reference potential;
  said second amplifier negative input and said second amplifier output being interconnected by a gain setting feedback circuit; and
  said second amplifier output being connected to said first capacitor terminal.

21. The sensor device according to claim 13, wherein said first switching element comprises:
  a first switch device interconnecting said first amplifier first input and said reference potential; and
  a second switch device having a plurality of selectively closeable switch paths interconnecting said first amplifier first input with a detected signal, including said at least one of said detection signals, thereby forming portion of said input paths.

22. The sensor device according to claim 13, further comprising:
  said first amplifier first input being a first amplifier negative input;
  said first amplifier second input being a first amplifier positive input;
  said first amplifier negative input, said first amplifier output and said input path being interconnected by a gain setting feedback circuit.

23. The sensor device according to claim 22, further comprising a buffer amplifier having a buffer amplifier input connected to said second capacitor terminal.

* * * * *